(12) United States Patent  
Tung et al.

(10) Patent No.: US 10,890,611 B2  
(45) Date of Patent: Jan. 12, 2021

(54) ELECTROSTATIC MEASURING SYSTEM FOR INNER WALL OF FLUID PIPELINE AND MEASURING METHOD THEREOF

(71) Applicant: INDUSTRIAL TECHNOLOGY RESEARCH INSTITUTE, Hsin-Chu (TW)

(72) Inventors: Mean-Jue Tung, Kinmen County (TW); Shi-Yuan Tong, Hsinchu County (TW); Yu-Ting Huang, Hsinchu (TW)

(73) Assignee: INDUSTRIAL TECHNOLOGY RESEARCH INSTITUTE, Hsin-Chu (TW)

( * ) Notice: Subject to any disclaimer, the term of this patent is extended or adjusted under 35 U.S.C. 154(b) by 202 days.

(21) Appl. No.: 16/232,810

(22) Filed: Dec. 26, 2018

(65) Prior Publication Data

US 2020/0174054 A1   Jun. 4, 2020

(30) Foreign Application Priority Data

Nov. 30, 2018   (TW) .............................. 107142858 A (51) Int. Cl.
  *G01R 29/12*   (2006.01)
  *G01N 27/60*   (2006.01)
  *G01R 29/24*   (2006.01)

(52) U.S. Cl.
  CPC .............. *G01R 29/12* (2013.01); *G01N 27/60* (2013.01); *G01R 29/24* (2013.01)

(58) Field of Classification Search
  USPC .................. 324/662, 663; 73/861.04, 861.11
  See application file for complete search history.

(56) References Cited

U.S. PATENT DOCUMENTS

| | | | |
|---|---|---|---|
| 4,258,736 A * | 3/1981 | Denbow | ................ G01N 27/06 137/2 |
| 5,042,299 A | 8/1991 | Wells | |

(Continued)

FOREIGN PATENT DOCUMENTS

| CN | 101131408 A | 2/2008 |
|---|---|---|
| CN | 102590643 A | 7/2012 |

(Continued)

OTHER PUBLICATIONS

Taiwan Patent Office, "Office Action", dated Aug. 29, 2019, Taiwan.

(Continued)

*Primary Examiner* — Vincent Q Nguyen (74) *Attorney, Agent, or Firm* — Locke Lord LLP; Tim Tingkang Xia, Esq.

(57) ABSTRACT

An electrostatic measuring method for an inner wall of a fluid pipeline includes a step of disposing a grounded metal plate to an outer wall of the fluid pipeline; a step of forming a grounding effect through the grounded metal plate and the outer wall, wherein the grounded metal plate has induced charges, the induced charges combine outer-wall existing charges on the outer wall to form total outer-wall charges, and the total outer-wall charges are related to charges to be measured on the inner wall of the fluid pipeline; and, a step of measuring an electrostatic voltage above the grounded metal plate so as to obtain the charges to be measured on the inner wall of the fluid pipeline. In addition, an electrostatic measuring system for inner wall of fluid pipeline is also provided.

9 Claims, 5 Drawing Sheets

(56) References Cited

U.S. PATENT DOCUMENTS

| | | | |
|---|---|---|---|
| 5,824,914 A * | 10/1998 | Seppa | G01F 1/588 |
| | | | 73/861.11 |
| 5,945,831 A | 8/1999 | Sargent et al. | |
| 7,337,662 B2 | 3/2008 | Sato et al. | |
| 7,432,725 B2 * | 10/2008 | Sieh | G01F 23/268 |
| | | | 324/662 |
| 8,820,143 B2 | 9/2014 | Sarma et al. | |
| 2009/0295400 A1 | 12/2009 | Wilhelm | |
| 2015/0040674 A1 | 2/2015 | Ishihara et al. | |

FOREIGN PATENT DOCUMENTS

| | | |
|---|---|---|
| CN | 103221831 A | 7/2013 |
| CN | 104316779 A | 1/2015 |
| CN | 204417613 U | 6/2015 |
| CN | 204462262 U | 7/2015 |
| CN | 105277804 A | 1/2016 |
| CN | 105129714 B | 11/2017 |
| TW | 590216 | 6/2004 |
| TW | I599761 B | 9/2017 |

OTHER PUBLICATIONS

Paillat, Thierry et al., ""Capacitive Sensor" to Measure Flow Electrification and Prevent Electrostatic Hazards", Sensors, vol. 12, 2012, pp. 14315-14326.

Lim, Lam Ghai et al., "Design of Helical Capacitance Sensor for Holdup Measurement in Two-Phase Stratified Flow: A Sinusoidal Function Approach", Sensors, vol. 16, 2016.

Tajdari, Teimour et al., "New technique to measure particle size using Electrostatic sensor", Journal of Electrostatics, vol. 72, Issue 2, Apr. 2014, pp. 120-128.

* cited by examiner

ELECTROSTATIC MEASURING SYSTEM FOR INNER WALL OF FLUID PIPELINE AND MEASURING METHOD THEREOF

CROSS REFERENCE TO RELATED APPLICATION

This application claims the benefits of Taiwan application Serial No. 107142858, filed on Nov. 30, 2018, the disclosures of which are incorporated by reference herein in its entirety.

TECHNICAL FIELD

The present disclosure relates in general to an electrostatic measuring system for an inner wall of a fluid pipeline and a measuring method thereof.

BACKGROUND

In manufacturing processes of semiconductor components, insulated pipelines are usually applied to transport ultrapure water, organic solvents, and the like fluid. While a fluid having low conductivity flows in an insulated pipeline, static electricity would be generated due to frictions between fluid particles, or between the fluid and an inner wall of the pipeline. This static electricity would be accumulated on the inner wall or the fluid itself. During a process of frictional electrification, the outmost electrons might get sufficient energy to transfer, and the polarity of the resultant electricity depends on the free energy of the material. In the process of conveying the fluid, the accumulated static electricity would eventually result in a risk of creating leak paths through the wall of pipeline, cause a flash fire and pipeline explosion, etc. Hence, the issue how to monitor the accumulated electrostatic charges on the inner wall of the pipeline in real time has become one of new concerns in factory affairs and industrial safety.

When the inner wall of the insulated pipeline carries static electricity, electric fields of this static electricity may attract free electric charges in the air down onto the outer wall of the insulated pipeline. On the other hand, residual static electricity (positive or negative) caused by frictions during mounting or operating the insulated pipeline would be left on the outer wall of the insulated pipeline. Since the static electricity on the outer wall of the insulated pipeline is unknown, it will interfere with the detection of electrostatic charge on the inner wall of the insulated pipeline. Moreover, since the electric field of the electric charges on the inner wall of the insulated pipeline always exists, the static electricity on the outer wall can't be easily removed by means of grounding or ion shower. Further, since the insulated pipeline for conveying the fluid is usually a close-loop system, thus an open-loop detection method for directly measuring the static electricity on the inner wall of the insulated pipeline cannot be applied. Furthermore, the static electricity accumulated on the outer wall of the pipeline can also affect the detection of the static electricity on the inner wall of the insulated pipeline. Thus, the difficulty in real-time monitoring the accumulated static electricity on the inner wall of the insulated pipeline is obvious.

SUMMARY

In this disclosure, an electrostatic measuring system for an inner wall of a fluid pipeline and a measuring method thereof are provided to reduce possible detection interference by the static electricity on an outer wall of the fluid pipeline. Also, the measurement of the accumulated static electricity on the inner wall of the fluid pipeline can be performed out of the fluid pipeline in a real-time manner, so that possible industrial safety event causes by the accumulated static electricity can be avoided.

According to this disclosure, the electrostatic measuring system for an inner wall of a fluid pipeline includes a grounded metal plate, an electrostatic sensing device and a processing device. The grounded metal plate, arranged to an outer wall of the fluid pipeline, forms a grounding effect with the outer wall so as to make the grounded metal plate have induced charges, and the induced charges combine outer-wall existing charges on the outer wall to form total outer-wall charges which are related to charges to be measured on the inner wall of the fluid pipeline. The electrostatic sensing device is coupled with the grounded metal plate so as to detect an electrostatic voltage above the grounded metal plate. The processing device, connected with the electrostatic sensing device, judges the value of electrostatic voltage above the grounded metal plate to obtain a voltage of the charges to be measured on the inner wall of the fluid pipeline.

According to this disclosure, the electrostatic measuring method for an inner wall of a fluid pipeline includes the steps of: (a) disposing a grounded metal plate to an outer wall of the fluid pipeline; (b) forming a grounding effect through the grounded metal plate and the outer wall; wherein the grounded metal plate has induced charges, the induced charges combine outer-wall existing charges on the outer wall to form total outer-wall charges, and the total outer-wall charges are related to charges to be measured on the inner wall of the fluid pipeline; and, (c) measuring an electrostatic voltage above the grounded metal plate so as to obtain the voltage of the charges to be measured on the inner wall of the fluid pipeline.

As stated, by providing the electrostatic measuring system for an inner wall of a fluid pipeline and a measuring method thereof in this disclosure, the induced charges on the grounded metal plate can combine the outer-wall existing charges (positive or negative) to form the total outer-wall charges which are related to the charges to be measured on the inner wall. Thereupon, the unknown outer-wall existing charges on the outer wall can be converted into the corresponding charges related to the charges to be measured on the inner wall of the fluid pipeline, and thus the interference caused by the static electricity on the outer wall of the fluid pipeline can be resolved. Also, since the total outer-wall charges on the outer wall is smaller than the charges to be measured on the inner wall, thus, even outside of the outer wall of the fluid pipeline, the sum effect of the charges to be measured on the inner wall and the total outer-wall charges on the outer wall can be sensed and measured. Thus, external measuring for the fluid pipeline can be performed in a real-time manner to monitor the accumulated static electricity on the inner wall of the fluid pipeline.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
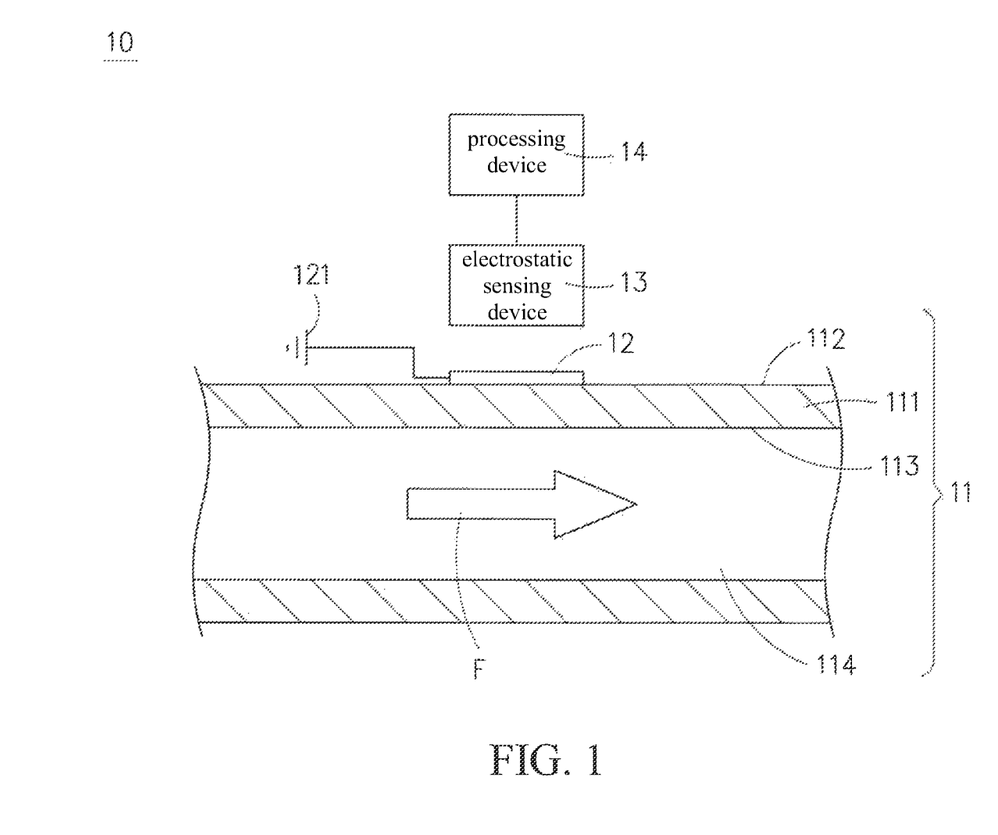
FIG. 1 is schematic view of an embodiment of the electrostatic measuring system for an inner wall of a fluid pipeline in accordance with this disclosure.

Referring now to FIG. 1, an embodiment of the electrostatic measuring system for an inner wall of a fluid pipeline in accordance with this disclosure is schematically shown. It is noted, that, in FIG. 1, only a portion of the fluid pipeline 11 is shown. In this embodiment, the electrostatic measuring system 10 for monitoring accumulated static electricity inside a fluid pipeline includes the fluid pipeline 11, a grounded metal plate 12, an electrostatic sensing device 13 and a processing device 14.

In this embodiment, the fluid pipeline 11 can be an insulated pipeline made of an insulation material. Materials for producing the fluid pipeline 11 can include Teflon, acrylics, a dielectric material, or a combination of the aforesaid materials. The fluid pipeline 11, as in a close-loop pipeline system, includes a main pipe body 111, an outer wall 112, an inner wall 113 and a flow pathway 114. The outer wall 112 and the inner wall 113 are located oppositely with respect to the main pipe body 111. In other words, the pipe thickness of the main pipe body 111 separates the outer wall 112 and the inner wall 113. Within the inner wall 113 of the main pipe body 111, the flow pathway 114 is formed for conveying an ultrapure water, an organic solvents, or any fluid F the like.

In this embodiment, the grounded metal plate 12, arranged exterior to the outer wall 112 of the fluid pipeline 11, is connected to a ground 121. The grounded metal plate 12 can be made of a metal selected from Cu, Ag, Au, Pt, Zn, Ni, Al, Co, Fe, Sn, Pb, Ti, steel or a combination of the aforesaid materials. The grounded metal plate 12 is to form a grounding effect with the outer wall 112. As shown in FIG. 1, the grounded metal plate 12 is preferably located on the outer wall 112 of the fluid pipeline 11. In some other embodiments, the grounded metal plate 12 can be located simply adjacent to the outer wall 112 of the fluid pipeline 11 by a specific distance. The requirement for this specific distance is to fulfill the grounding effect between the grounded metal plate 12 and the outer wall 112. In addition, the configuration of the grounded metal plate 12 can be adjusted in accordance with the local shape of the fluid pipeline 11. For example, in the case that the fluid pipeline 11 is a round tube or a curved tube, then the grounded metal plate 12 shall have a corresponding pairing curved structure. If the fluid pipeline 11 is a square pipe or has a flat surface, then the grounded metal plate 12 can be designed to have a corresponding flat surface.

In this embodiment, it is assumed that the inner wall 113 of the fluid pipeline 11 has a charges to be measured, and the outer wall 112 of the fluid pipeline 11 has already an outer-wall existing charge. While the inner wall 113 of the fluid pipeline 11 carries static electricity (i.e., the charges to be measured in this embodiment), the electric field emitted therefrom would cause free electric charges in the air to be attracted and adsorbed on the outer wall 112 of the fluid pipeline 11, such that the outer-wall existing charge is formed. On the other hand, the outer-wall existing charge on the outer wall 112 can also be formed by the residual static electricity (positive or negative) caused by frictions during mounting or operating the insulated pipeline 11.

In this embodiment, as the grounded metal plate 12 is mounted onto the outer wall 112 of the fluid pipeline 11, and after the grounding effect has been activated between the grounded metal plate 12 and the outer wall 112, then the grounded metal plate 12 would have an induced charge. In other words, as soon as the grounded metal plate 12 is connected to a ground, according to the effect of electric field, charges opposite to the polarity of the charges to be measured on the inner wall 113 of the fluid pipeline 11 would be induced on the grounded metal plate 12. Then, total outer-wall charges can be obtained by adding these induced charges and the outer-wall existing charges (positive or negative). Namely, at this time, the total outer-wall charges on the outer wall 113 would be now not an unknown anymore, but related to the charges to be measured on the inner wall 113 of the fluid pipeline 11. Thereupon, the interference caused by the static electricity on the outer wall 112 of the fluid pipeline 11 can be resolved. Further, since the total outer-wall charges on the outer wall 112 are usually less than the charges to be measured on the inner wall 113. Namely, a ratio of the total outer-wall charges to the charges to be measured is usually less than 1, and is a scale dependent of the thickness and materials of the main pipe body 111.

In this embodiment, the electrostatic sensing device 13, coupled with the grounded metal plate 12, is located above, but separated from, the grounded metal plate 12. As shown in FIG. 1, the electrostatic sensing device 13 is located above the grounded metal plate 12, and the electrostatic sensing device 13 is separated from the grounded metal plate 12. That is, the electrostatic sensing device 13 is not connected to the grounded metal plate 12, and there is a sensing distance between the electrostatic sensing device 13 and the grounded metal plate 12. In some other embodiments, the electrostatic sensing device 13 can be assembled with the grounded metal plate 12 (i.e., the electrostatic sensing device 13 is connected physically with the grounded metal plate 12). Since any object with static electricity will generate electric field, thus the electrostatic sensing device 13 can detect the static electricity via sensing the corresponding effect of electric field. Thereupon, the electrostatic sensing device 13 of this embodiment can be applied to sense the electrostatic voltage value above the grounded metal plate 12. The electrostatic sensing device 13 can be a single electrode, a unit or assembly of a sensing device produced from composite materials, and can be a single element or array of sensing elements, or any the like that meets practical requirements of the electrostatic sensing device 13. In the case that the composite material are used, the electrostatic sensing device is consisted of an electrode and a dielectric film, and the material of the dielectric film is, for example, an oxide $ABO_3$ having a perovskite structure, in which A is Ba, Pb, Mg or any combination, and B is Ti, Zr, Hf, Sn, Ta, Mn, Co, Fe, Ni, Zn, Al, Mg or any combination. In addition, the dielectric film can be a single layer or a multilayer composite material. As described above, since the total outer-wall charges on the outer wall 112 of the fluid pipeline 11 would be less than the charges to be measured on the inner wall 113, thus, even out away from the outer wall 112 of the fluid pipeline 11, combined effect of the charges to be measured on the inner wall 113 and the total outer-wall charges on the outer wall 112 can still be detected and measured.

In this embodiment, the processing device 14, connected with the electrostatic sensing device 13, can be embodied through hardware (such as an IC chip or a CPU), software (such as program commands executed by a processor), or a hybrid means. The electrostatic sensing device 13 can transmit the detection results of the combined effect of the charges to be measured on the inner wall 113 and the total outer-wall charges on the outer wall 112 to the processing device 14. In an exemplary example, the processing device 14 can include a signal-processing component and an output-displaying component. The signal-processing component is used to convert the detection results of the combined effect of the charges to be measured on the inner wall 113 and the total outer-wall charges on the outer wall 112 into corresponding signal outputs or specific values by a signal processing. These signal outputs or specific values can be displayed by the output-displaying component. However, in this disclosure, the processing device is not limited as above, and can be adjusted to meet practical demands.

In this embodiment, the processing device 14 judges an electrostatic voltage above the grounded metal plate 12 so as further to obtain a voltage of the charges to be measured on the inner wall 113 of the fluid pipeline 11. Empirically, a linear relationship exists between the electrostatic voltage above the grounded metal plate 12 and the voltage of the charges to be measured on the inner wall 113 of the fluid pipeline 11. Namely, the voltage of the charges to be measured on the inner wall 113 of the fluid pipeline 11 can be obtained by multiplying a specific factor to the electrostatic voltage above the grounded metal plate 12, and the ratio of the electrostatic voltage above the grounded metal plate 12 to the voltage of the charges to be measured on the inner wall 113 of the fluid pipeline 11 is less than 1. In other words, the voltage of the charges to be measured on the inner wall 113 of the fluid pipeline 11 is greater than the electrostatic voltage above the grounded metal plate 12. Accordingly, by measuring the electrostatic voltage above the grounded metal plate 12, the voltage of the charges to be measured on the inner wall 113 of the fluid pipeline 11 can be obtained. Thereupon, the object of real-time monitoring the accumulated static electricity on the inner wall 113 of the fluid pipeline 11 can thus be achieved.

Figure 2:
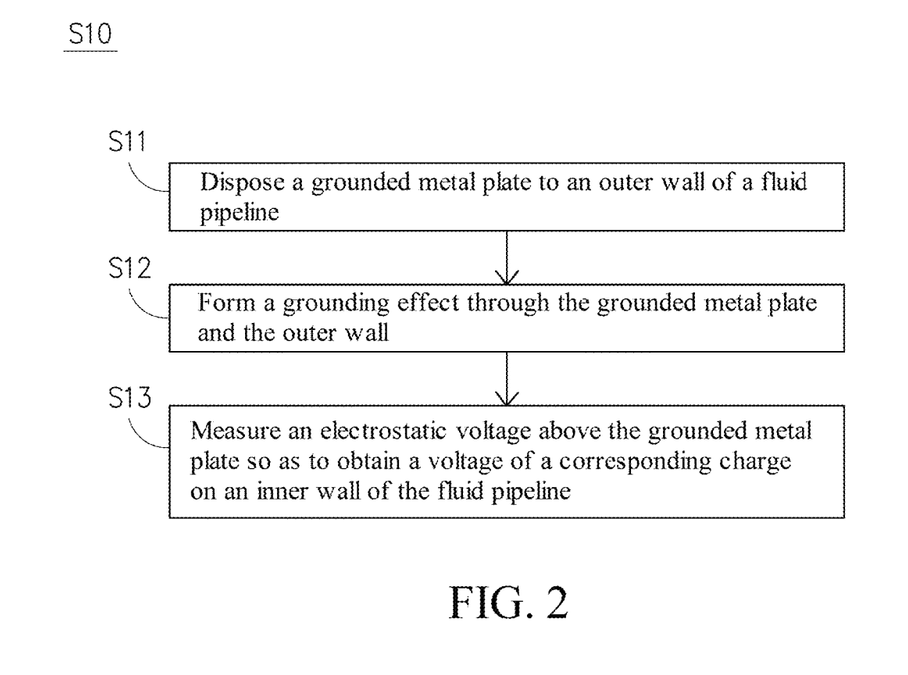
FIG. 2 shows schematically a flowchart of an embodiment of the electrostatic measuring method for an inner wall of a fluid pipeline in accordance with this disclosure.

Referring now to FIG. 2, a flowchart of an embodiment of the electrostatic measuring method S10 for the inner wall 113 of the fluid pipeline 11 in accordance with this disclosure is demonstrated schematically. This method S10 is particularly applied to the electrostatic measuring system of FIG. 1. The electrostatic measuring method for an inner wall of a fluid pipeline S10 includes Step S11 to Step S13 as follows.

Firstly, Step S11 is performed to dispose a grounded metal plate 12 to an outer wall 112 of a fluid pipeline 11. Referring to FIG. 1, the grounded metal plate 12 is preferably located on the outer wall 112 of the fluid pipeline 11. In some other embodiments, the grounded metal plate 12 can be located simply adjacent to the outer wall 112 of the fluid pipeline 11 by a specific distance.

Then, Step S12 is performed to form a grounding effect through the grounded metal plate 12 and the outer wall 112. Referring to FIG. 1, the grounded metal plate 12, connected to a ground 121, is used to form the grounding effect with the outer wall 112.

As the grounding effect has been activated between the grounded metal plate 12 and the outer wall 112, then the grounded metal plate 12 would have an induced charge. In other words, as soon as the grounded metal plate 12 is connected to a ground, according to the effect of electric field, charges opposite to the polarity of the charges to be measured on the inner wall 113 of the fluid pipeline 11 would be induced on the grounded metal plate 12. Then, total outer-wall charges can be obtained by adding these induced charges and the outer-wall existing charges (positive or negative). Namely, at this time, the total outer-wall charges on the outer wall 113 would be now not an unknown anymore, but related to the charges to be measured on the inner wall 113 of the fluid pipeline 11. Thereupon, the interference caused by the static electricity on the outer wall 112 of the fluid pipeline 11 can be resolved. Further, since the total outer-wall charges on the outer wall 112 are usually less than the charges to be measured on the inner wall 113. Namely, a ratio of the total outer-wall charges to the charges to be measured is usually less than 1, and is a scale dependent of the thickness and materials of the main pipe body 111.

Then, Step S13 is performed to measure an electrostatic voltage above the grounded metal plate 12 so as to obtain a voltage of corresponding charges on the inner wall 113 of the fluid pipeline 11. Referring to FIG. 1, the electrostatic sensing device 13 senses and measures induction results of the combined effect of the charges to be measured on the inner wall 113 and the total outer-wall charges on the outer wall 112. Then, the processing device 14 judges an electrostatic voltage value above the grounded metal plate 12 so as further to obtain a voltage of the charges to be measured on the inner wall 113 of the fluid pipeline 11. Empirically, a linear relationship exists between the electrostatic voltage above the grounded metal plate 12 and the voltage of the charges to be measured on the inner wall 113 of the fluid pipeline 11. Namely, the voltage of the charges to be measured on the inner wall 113 of the fluid pipeline 11 can be obtained by multiplying a specific factor to the electrostatic voltage above the grounded metal plate 12, and the ratio of the electrostatic voltage above the grounded metal plate 12 to the voltage of the charges to be measured on the inner wall 113 of the fluid pipeline 11 is less than 1. In other words, the voltage of the charges to be measured on the inner wall 113 of the fluid pipeline 11 is greater than the electrostatic voltage above the grounded metal plate 12. Accordingly, the electrostatic measuring method for an inner wall of a fluid pipeline S10 provided by this disclosure can measure the electrostatic voltage above the grounded metal plate 12 and the voltage of the charges to be measured on the inner wall 113 of the fluid pipeline 11 can be obtained. Thereupon, the object of real-time monitoring the accumulated static electricity on the inner wall 113 of the fluid pipeline 11 can thus be achieved.

Figure 3A:
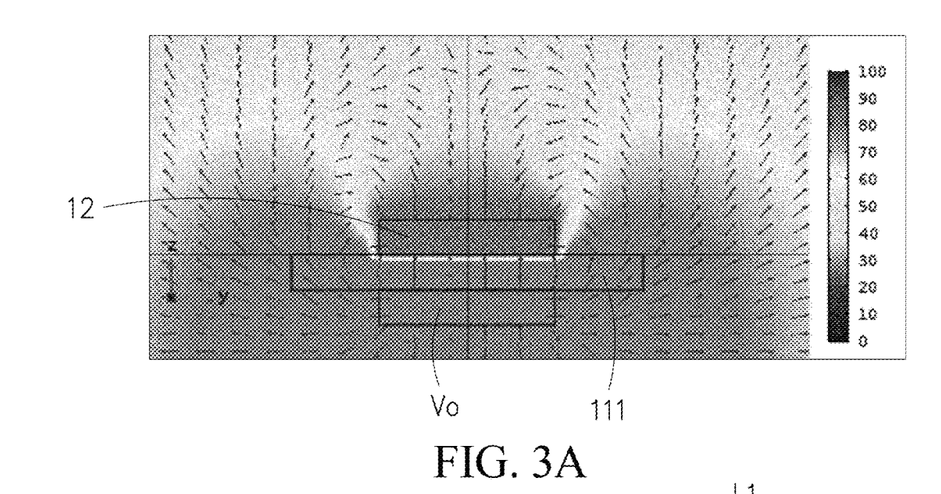
FIG. 3A demonstrates schematically simulation results of an electrostatic field and voltage distribution for the electrostatic measuring system for an inner wall of a fluid pipeline of FIG. 1.
Figure 3B:
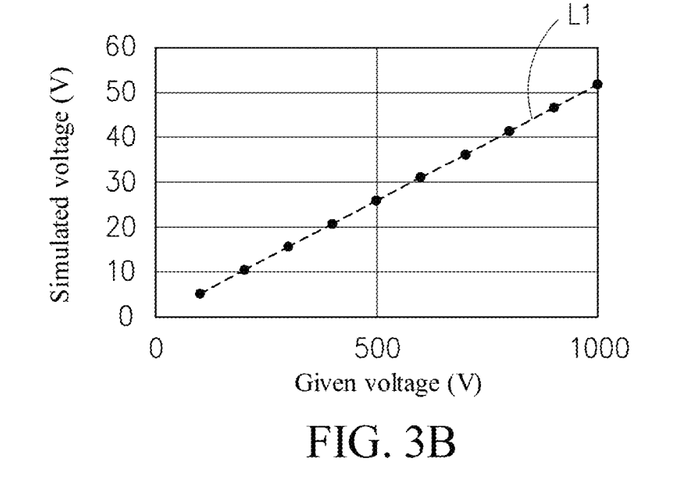
FIG. 3B is a schematic plot showing the relationship of given voltages and simulated voltages for the simulation results of FIG. 3A.

Referring now to FIG. 1, FIG. 3A and FIG. 3B; where FIG. 3A demonstrates schematically simulation results of an electrostatic field and voltage distributions for the electrostatic measuring system for an inner wall of a fluid pipeline of FIG. 1, and FIG. 3B is a schematic plot showing the relationship of given voltages and simulated voltages for the simulation results of FIG. 3A. In this embodiment, the model for simulating the electrostatic field is the electrostatic measuring system for an inner wall of a fluid pipeline 10 shown in FIG. 1. In addition, the main pipe body 111 of the fluid pipeline 11 is made of Teflon having a thickness of 1 mm, and a voltage Vo is given to the inner wall 113. As the voltage of static electricity on the inner wall 113 (given voltage Vo) is 500V, and the grounded metal plate 12 is located on the outer wall 112, the simulation results of the electrostatic field and voltage distribution are shown in FIG. 3A, wherein the electrostatic field distribution is illustrated by arrow. From the simulation result of voltage distribution, the electrostatic voltage above the grounded metal plate 12 ranges from 20V to 30V. In other words, the electrostatic voltage above the grounded metal plate 12 is less than the given voltage Vo on the inner wall 113. By providing the electrostatic measuring system for an inner wall of a fluid pipeline and a measuring method thereof, the unknown outer-wall existing charges and the induced charges on the outer wall 112 can be combined and further converted into the total outer-wall charges which are related to the charges to be measured on the inner wall 113 of the fluid pipeline 11, so that the total outer-wall charges on the outer wall 112 can be related to the charges to be measured on the inner wall 113. Thereupon, the interference by the static electricity on the outer wall 112 of the fluid pipeline 11 can be resolved. In addition, since the total outer-wall charges of the outer wall 112 would be less than the charges to be measured on the inner wall 113, thus, even outside of the outer wall 112 of the fluid pipeline 11, the induction results of the combined effect of the charges to be measured on the inner wall 113 and the total outer-wall charges on the outer wall 112 can be sensed and measured. Thus, external measuring for the fluid pipeline can be performed in a real-time manner to monitor the accumulated static electricity on the inner wall of the fluid pipeline.

In further simulations, the given voltage Vo on the inner wall 113 is varied, and the electrostatic sensing device 13 is used to detect the electrostatic voltage above the grounded metal plate 12 (i.e., the simulated voltages of FIG. 3B). The simulation results are shown in FIG. 3B, a linear relationship is shown between the simulated voltages above the grounded metal plate 12 and the given voltages Vo on the inner wall 113. Each of the simulated voltages is in correspondence with a given voltage Vo according to a slope line L1. Thus, from the electrostatic voltage above the grounded metal plate 12 detected by the electrostatic sensing device 13, the voltage of the charges to be measured on the inner wall 113 of the fluid pipeline 11 can be obtained, and therefrom the static electricity on the inner wall 113 can be realized.

Figure 4A:
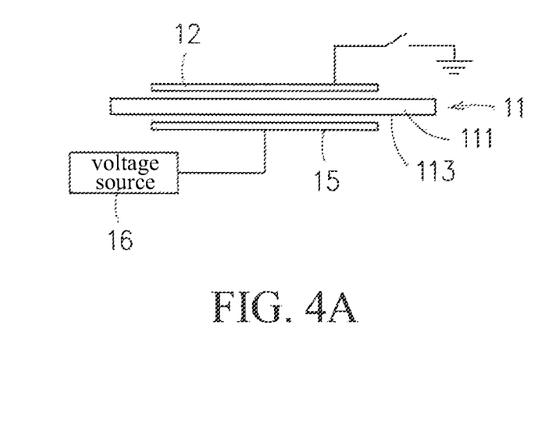
FIG. 4A is a schematic view of an experimental structure for the electrostatic measuring system for an inner wall of a fluid pipeline in accordance with this disclosure.
Figure 4B:
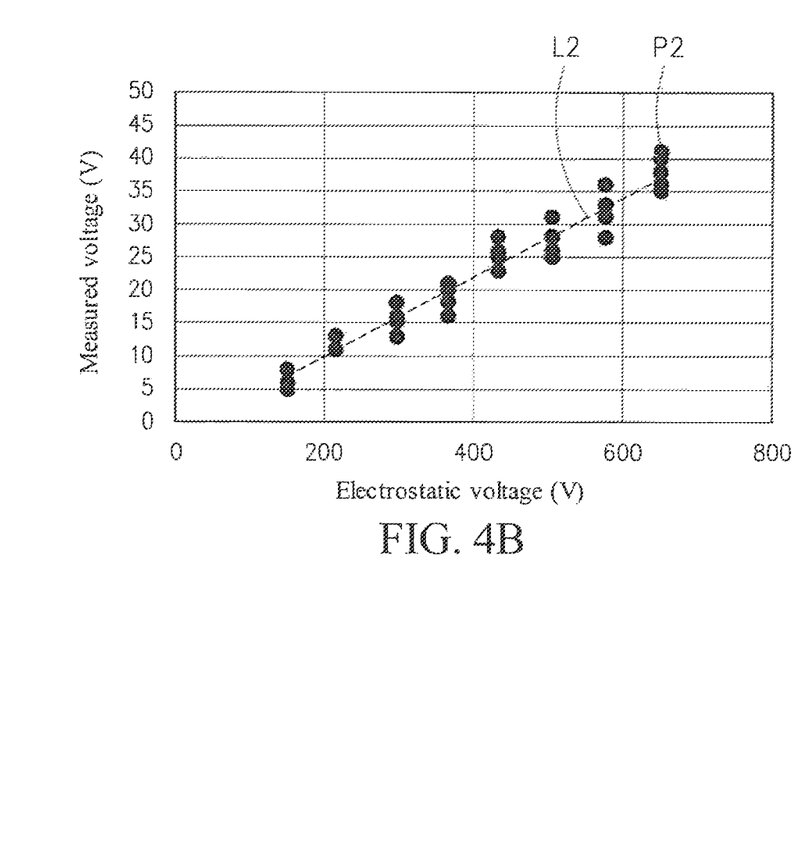
FIG. 4B is a schematic plot showing the relationship of electrostatic voltages and measured voltages for the experimental results of FIG. 4A.

Refer now to FIG. 4A and FIG. 4B; where FIG. 4A is a schematic view of an experimental structure of the electrostatic measuring system for an inner wall of a fluid pipeline in accordance with this disclosure, and FIG. 4B is a schematic plot showing the relationship of electrostatic voltages and measured voltages for the experimental results of FIG. 4A. As shown in FIG. 4A, a Teflon is used to simulate the main pipe body 111 of the fluid pipeline 11, the Teflon with different charged state is used to simulate the unknown electric charges existing on the outer wall 112 of the fluid pipeline 11, an electrode 15 located under the main pipe body 111 is used to simulate the static electricity on the inner wall 113 of the main pipe body 111. The electrode 15 is connected with the voltage source 16, and the voltage of the electrode 15 can be set by the voltage source 16 as the electrostatic voltage on the inner wall 113 of the main pipe body 111. Also, with a grounded metal plate 12 disposed above the main pipe body 111, and can be grounded through the switch, and the electrostatic sensing device can be used to detect the electrostatic voltage as the measured voltage above the grounded metal plate 12 as shown in FIG. 1. The voltage of the electrode 15 can be set by the voltage source 16. Then, plural testing are executed upon different electrostatic voltages with different charged state of Teflon. From FIG. 4B, the measurement points P2 with different electrostatic voltages of the electrode 15 under the main pipe body 111 and corresponding measured voltages are substantially linear along the slope line L2, with variance less than ±20%. Obviously, the electrostatic measuring system for an inner wall of a fluid pipeline and the measuring method thereof provided by this disclosure can actually eliminate the interference by the static electricity on the outer wall of the fluid pipeline, and also can be performed exterior to the fluid pipeline, so that the accumulated static electricity on the inner wall of the fluid pipeline can be monitored in a real-time manner, and such that possible industrial safety event caused by the accumulated static electricity can be reduced.

Figure 5A:
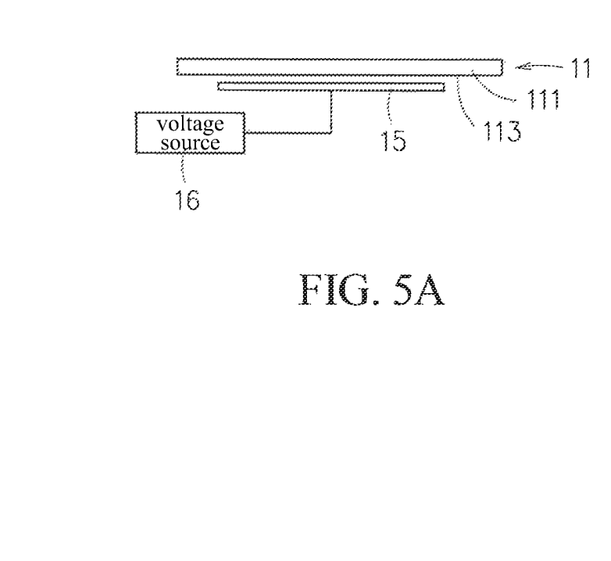
FIG. 5A is a reference structure to FIG. 4A.
Figure 5B:
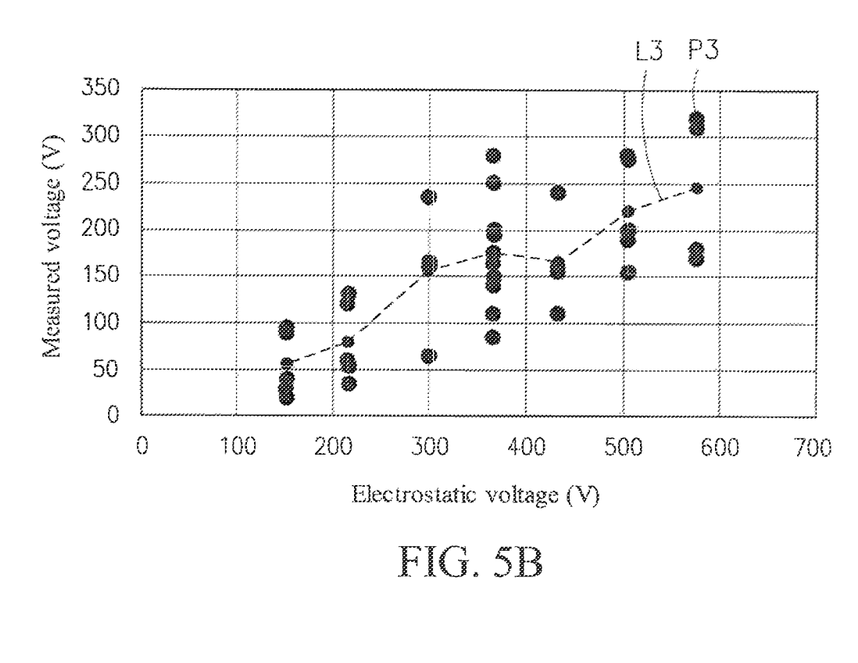
FIG. 5B is a schematic plot showing the relationship of electrostatic voltages and measured voltages for the experimental results of FIG. 5A.

Refer now to FIG. 5A and FIG. 5B; where FIG. 5A is a reference structure to FIG. 4A, and FIG. 5B is a schematic plot showing the relationship of electrostatic voltages and measured voltages for the experimental results of FIG. 5A. As shown in FIG. 5A, a Teflon is used to simulate the main pipe body 111 of the fluid pipeline 11, the Teflon with different charged state is used to simulate the unknown electric charges existing on the outer wall 112 of the fluid pipeline 11, an electrode 15 located under the main pipe body 111 is used to simulate the static electricity on the inner wall 113 of the main pipe body 111. The electrode 15 is connected with the voltage source 16, and the voltage of the electrode 15 can be set by the voltage source 16 as the electrostatic voltage on the inner wall 113 of the main pipe body 111. FIG. 5A is a comparison structure of the electrostatic measuring system for an inner wall of a fluid pipeline 10 provided by this disclosure, therefore, no grounded metal plate is disposed above the main pipe body 111. The electrostatic sensing device 13 shown in FIG. 1 can be used to measure the voltage above the main pipe body 111 (as the measured voltage). The voltage of the electrode 15 can be set by the voltage source 16. Then, plural testing are executed upon different electrostatic voltages with different charged state of Teflon. The measurement points P3 with different electrostatic voltages of the electrode 15 under the main pipe body 111 and corresponding measured voltages are deviated significantly from the slope line L3, and the measured voltage has no obvious linear relationship with the electrostatic voltage of the electrode 15 under the main pipe body 111, and the measurement variance with respect to the slope line L3 is about ±60%. Such a phenomenon is caused by the existence of the interference by the outer-wall existing charges on the outer wall 112 of the fluid pipeline 11. On the other hand, from the difference between the experimental structure of FIG. 4A, FIG. 4B and that of FIG. 5A, FIG. 5B, it is proved that the inclusion of the grounded metal plate 12 in this disclosure can combine and convert the unknown outer-wall existing charges and induced charges on the grounded metal plate 12 into the total outer-wall charges related to the charges to be measured on the inner wall 113 of the fluid pipeline 11, such that the total outer-wall charges on the outer wall 112 are no more unknown. Thereupon, the interference caused by the static electricity on the outer wall of the fluid pipeline can be avoided, more stable voltage signals (±20%) can be obtained, and thus the static electricity on the inner wall 113 of the fluid pipeline 11 can be obtained.

In summary, by providing the electrostatic measuring system for an inner wall of a fluid pipeline and a measuring method thereof in this disclosure, the induced charges on the grounded metal plate can combine the outer-wall existing charges (positive or negative) to form the total outer-wall charges related to the charges to be measured on the inner wall. Thereupon, the unknown outer-wall existing charges on the outer wall can be converted into the corresponding charges related to the charges to be measured on the inner wall of the fluid pipeline, and thus the interference caused by the static electricity on the outer wall of the fluid pipeline can be resolved. Also, since the total outer-wall charges on the outer wall is smaller than the charges to be measured on the inner wall, thus, even outside of the outer wall of the fluid pipeline, the sum effect of the charges to be measured on the inner wall and the total outer-wall charges on the outer wall can be sensed and measured. Thus, external measuring for the fluid pipeline can be performed in a real-time manner to monitor the accumulated static electricity on the inner wall of the fluid pipeline.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. An electrostatic measuring system for an inner wall of a fluid pipeline, comprising:
    a grounded metal plate, arranged to an outer wall of the fluid pipeline, forming a grounding effect with the outer wall to make the grounded metal plate have induced charges, the induced charges combining outer-wall existing charges on the outer wall to form total outer-wall charges, wherein the total outer-wall charges are related to charges to be measured on the inner wall of the fluid pipeline;
    an electrostatic sensing device, coupled with the grounded metal plate to detect an electrostatic voltage above the grounded metal plate; and
    a processing device, connected with the electrostatic sensing device, judging the electrostatic voltage on the grounded metal plate to obtain a voltage of the charges to be measured on the inner wall of the fluid pipeline.

2. The electrostatic measuring system for an inner wall of a fluid pipeline of claim 1, wherein the electrostatic sensing device is separated from the grounded metal plate.

3. The electrostatic measuring system for an inner wall of a fluid pipeline of claim 1, wherein the electrostatic sensing device is assembled with the grounded metal plate.

4. The electrostatic measuring system for an inner wall of a fluid pipeline of claim 1, wherein the grounded metal plate is made of a material selected from the group of Cu, Ag, Au, Pt, Zn, Ni, Al, Co, Fe, Sn, Pb, Ti, steel or a combination of the aforesaid materials.

5. The electrostatic measuring system for an inner wall of a fluid pipeline of claim 1, wherein a ratio of the total outer-wall charges to the charges to be measured is less than 1.

6. The electrostatic measuring system for an inner wall of a fluid pipeline of claim 1, wherein a linear relationship is formed between the electrostatic voltage above the grounded metal plate and a voltage of the charges to be measured on the inner wall of the fluid pipeline.

7. The electrostatic measuring system for an inner wall of a fluid pipeline of claim 1, wherein the electrostatic sensing device is selected from the group of a single electrode, and a unit or assembly of composite materials.

8. An electrostatic measuring method for an inner wall of a fluid pipeline, comprising the steps of:
    (a) disposing a grounded metal plate to an outer wall of the fluid pipeline;
    (b) forming a grounding effect through the grounded metal plate and the outer wall; wherein the grounded metal plate has induced charges, the induced charges combine outer-wall existing charges on the outer wall to form total outer-wall charges, and the total outer-wall charges are related to charges to be measured on the inner wall of the fluid pipeline; and
    (c) measuring an electrostatic voltage above the grounded metal plate so as to obtain the charges to be measured on the inner wall of the fluid pipeline.

9. The electrostatic measuring method for an inner wall of a fluid pipeline of claim 8, wherein the step (b) includes a step of, according to the effect of electric field, inducing the induced charges opposite to the polarity of the charges to be measured on the inner wall on the grounded metal plate.

* * * * *